US012676592B2

(12) United States Patent
    Okawa et al.

(10) Patent No.: US 12,676,592 B2
(45) Date of Patent: Jul. 7, 2026

(54) PIEZOELECTRIC VIBRATION ELEMENT HAVING CONDUCTIVE ETCH STOP, PIEZOELECTRIC VIBRATOR, AND PIEZOELECTRIC OSCILLATOR

(71) Applicant: Murata Manufacturing Co., Ltd., Nagaokakyo (JP)

(72) Inventors: Tadayuki Okawa, Nagaokakyo (JP); Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 720 days.

(21) Appl. No.: 18/303,614

(22) Filed: Apr. 20, 2023

(65) Prior Publication Data

US 2023/0261635 A1     Aug. 17, 2023

Related U.S. Application Data

(63) Continuation of application No. PCT/JP2021/022646, filed on Jun. 15, 2021.

(30) Foreign Application Priority Data

Nov. 26, 2020    (JP) ................................. 2020-196170

(51) Int. Cl.
| | |
|---|---|
| *H03H 9/13* | (2006.01) |
| *H03B 5/32* | (2006.01) |
| *H03H 9/10* | (2006.01) |
| *H03H 9/19* | (2006.01) |

(52) U.S. Cl.
CPC ............... *H03H 9/131* (2013.01); *H03B 5/32* (2013.01); *H03H 9/1021* (2013.01); *H03H 9/19* (2013.01)

(58) Field of Classification Search
CPC ........ H03H 9/131; H03H 9/1021; H03H 9/19; H03H 9/0595; H03H 9/1035; H03H 9/13; H03B 5/32; H10W 76/10
See application file for complete search history.

(56) References Cited

U.S. PATENT DOCUMENTS

| | | | | |
|---|---|---|---|---|
| 9,787,280 | B2 * | 10/2017 | Son | .................... H03H 9/02086 |
| 2006/0255691 | A1 | 11/2006 | Kuroda et al. | |
| 2014/0167566 | A1 | 6/2014 | Kando | |

(Continued)

FOREIGN PATENT DOCUMENTS

| | | |
|---|---|---|
| JP | 2010004456 A | 1/2010 |
| JP | 2013030958 A | 2/2013 |
| JP | 2014192650 A | 10/2014 |

(Continued)

OTHER PUBLICATIONS

International Search Report in PCT/JP2021/022646, mailed Aug. 24, 2021, 3 pages.

*Primary Examiner* — Emily P Pham
(74) *Attorney, Agent, or Firm* — ArentFox Schiff LLP

(57) ABSTRACT

A piezoelectric vibration element that includes a piezoelectric piece having a first principal surface and a second principal surface; a via electrode penetrating the piezoelectric piece from the first principal surface to the second principal surface thereof; a conductive etch stop film covering the via electrode on the second principal surface; and a wiring electrode covering at least part of an outer edge of the conductive etch stop film on the second principal surface.

19 Claims, 7 Drawing Sheets

(56)     References Cited

U.S. PATENT DOCUMENTS

2015/0123744  A1     5/2015  Nishimura et al.
2016/0164490  A1     6/2016  Kamijo et al.

FOREIGN PATENT DOCUMENTS

JP        2015091066  A     5/2015
WO        2006104265  A1   10/2006
WO        2013031747  A1    3/2013

* cited by examiner

100

30

11'

12a

10A

16b

17

11E

15b

11E

11B

14a

11A

11B

11D

16b

15a

11C

16a

X

Z'

Y'

PIEZOELECTRIC VIBRATION ELEMENT HAVING CONDUCTIVE ETCH STOP, PIEZOELECTRIC VIBRATOR, AND PIEZOELECTRIC OSCILLATOR

CROSS REFERENCE TO RELATED APPLICATIONS

The present application is a continuation of International application No. PCT/JP2021/022646, filed Jun. 15, 2021, which claims priority to Japanese Patent Application No. 2020-196170, filed Nov. 26, 2020, the entire contents of each of which are incorporated herein by reference.

FIELD OF THE INVENTION

The present invention relates to a piezoelectric vibration element, a piezoelectric vibrator, and a piezoelectric oscillator.

BACKGROUND OF THE INVENTION

Vibration elements or vibrators including the vibration elements have been used in various electronic devices such as mobile communication terminals, communication base stations, and consumer electronics, for various use purposes such as timing devices, sensors, and oscillators. With increases in functionality of electronic devices, small-sized vibration elements have been desired.

For example, a piezoelectric bulk wave device is disclosed in Patent Document 1, in which the device includes a support substrate, an insulating layer, and a piezoelectric thin-plate vibrating part and the piezoelectric thin-plate vibrating part includes a piezoelectric thin plate, a first electrode formed on an upper surface of the piezoelectric thin plate, and a second electrode formed on a lower surface of the piezoelectric thin plate. In this piezoelectric bulk wave device, a via hole electrode is provided in the piezoelectric thin plate so as to be electrically connected to a wiring electrode connected to the second electrode.

Patent Document 1: International Publication No. 2013/031747

SUMMARY OF INVENTION

In the piezoelectric bulk wave device disclosed in Patent Document 1, an electrode hole for via hole formation is formed in the piezoelectric thin plate by etching, and a via hole electrode is formed next.

However, when the piezoelectric thin plate is etched, the wiring electrode formed on the piezoelectric thin plate tends to suffer damage by a chemical agent for use in etching. As a result, there is a fear of a decrease in performance of bringing an electrode formed in the vibrating part into conduction via the via hole electrode and wiring connection (hereinafter referred to as "conduction").

The present invention has been made in view of these circumstances, and one object is to provide a piezoelectric vibration element, a piezoelectric vibrator, and a piezoelectric oscillator capable of suppressing damage on a wiring electrode by etching.

A piezoelectric vibration element according to one aspect of the present invention includes: a piezoelectric piece having a first principal surface and a second principal surface; a via electrode penetrating the piezoelectric piece from the first principal surface to the second principal surface thereof; a conductive etch stop film covering the via electrode on the second principal surface; and a wiring electrode covering at least part of an outer edge of the conductive etch stop film on the second principal surface.

A piezoelectric vibrator according to another aspect of the present invention includes: the above-described piezoelectric vibration element; and a support substrate supporting the above-described piezoelectric vibration element so that the piezoelectric vibration element can vibrate.

A piezoelectric oscillator according to another aspect of the present invention includes the above-described piezoelectric vibrator; and a lid body attached to the support substrate so as to define a space therebetween for accommodating the piezoelectric vibration element.

According to the present invention, damage on a wiring electrode by etching can be suppressed.

DETAILED DESCRIPTION OF THE PREFERRED EMBODIMENTS

Figure 1:
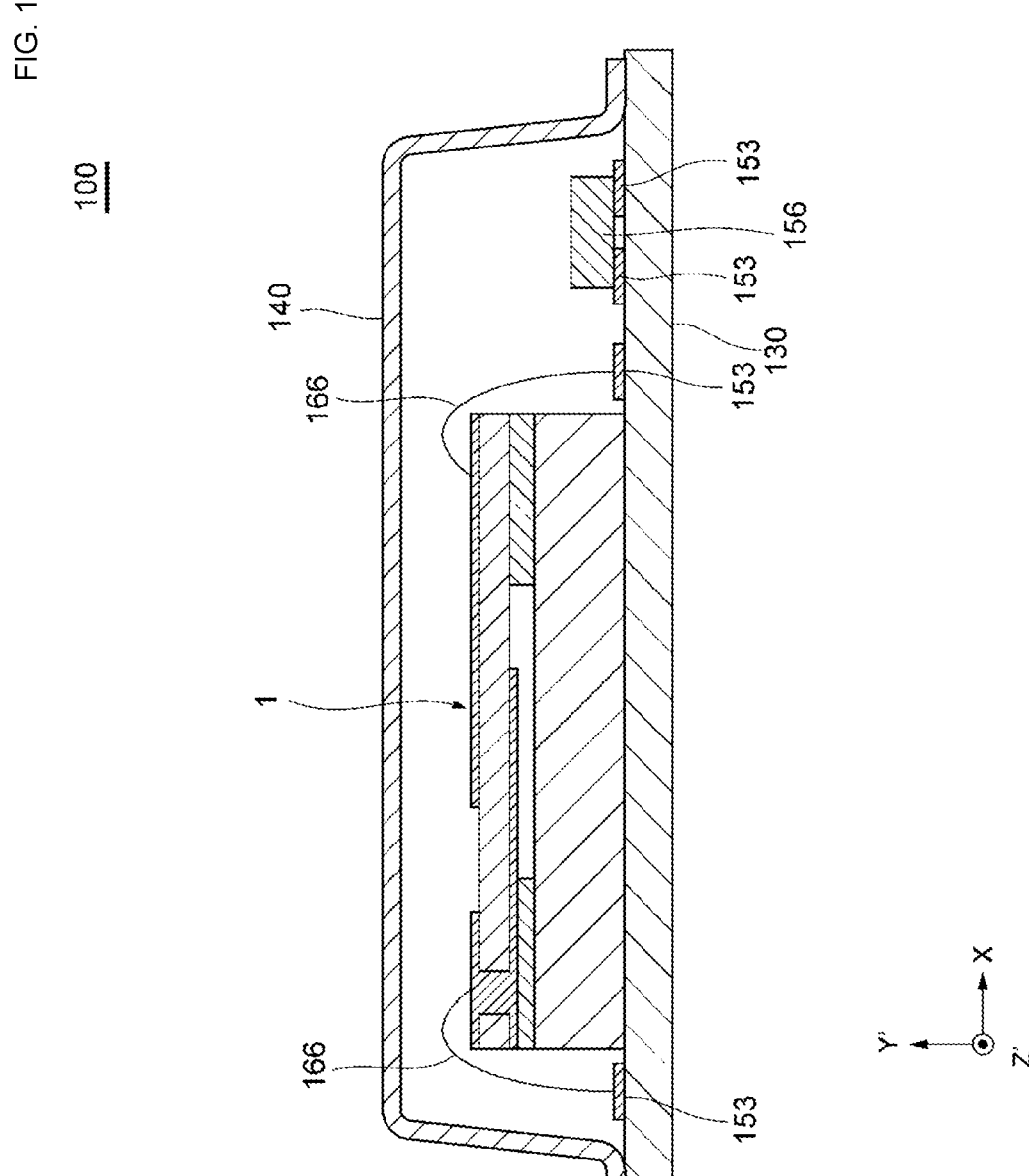
FIG. 1 is a sectional view schematically depicting the structure of a crystal oscillator in one embodiment.

In the following, an embodiment of the present invention is described. In the following description of the drawings, identical or similar components are represented with identical or similar reference characters. The drawings represent examples, the dimension and shape of each part are schematic ones, and the technical scope of the present invention should not be construed as being limited to the embodiment.

In each drawing, for clarification of mutual relations among the respective drawings and for assistance in understanding positional relations among the respective members, an orthogonal coordinate system formed of an X axis, a Y' axis, and a Z' axis may be provided for convenience. The X axis, the Y' axis, and the Z' axis mutually correspond to those in each drawing. The respective X axis, Y' axis, and Z' axis correspond to crystallographic axes of a quartz piece 11, which will be described below. The X axis corresponds to the electrical axis (polar axis) of crystal, a Y axis corresponds to the mechanical axis of crystal, and a Z axis corresponds to the optical axis of crystal. The Y' axis and the Z' axis are axes obtained by rotating the Y axis and the Z axis about the X axis by 35 degrees 15 minutes±1 minute 30 seconds to a direction from the Y axis to the Z axis.

In the following description, a direction parallel to the X axis is referred to as an "X axis direction", a direction parallel to the Y' axis is referred to as a "Y' axis direction", and a direction parallel to the Z' axis is referred to as a "Z' axis direction". Also, a tip direction of an arrow of each of the X axis, the Y' axis, and the Z' axis is referred to as a "positive" or "+(plus)", and a direction opposite to the arrow is referred to as a "negative" or "– (minus)". Note that while description is made by taking the +Y' axis direction as an upper direction and the –Y' axis direction as a lower direction for convenience, upward and downward orientation of a quartz crystal vibration element 10, a quartz crystal vibrator 1, and a crystal oscillator 100 are not limited. Also, a plane specified by the X axis and the Z' axis is taken as a Z'X plane, and the same goes for planes specified by other axes.

First, with reference to FIG. 1, the schematic structure of a crystal oscillator according to one embodiment is described. FIG. 1 is a sectional view schematically depicting the structure of a crystal oscillator 100 in the one embodiment.

In the following description, as a piezoelectric oscillator, a crystal oscillator (XO) including a quartz crystal vibrator (quartz crystal resonator unit) is described as an example. Also, as a piezoelectric vibrator, a quartz crystal vibrator including a quartz crystal vibration element (quartz crystal resonator) is described as an example. Furthermore, as a piezoelectric vibration element, a quartz crystal vibration element including a quartz piece (quartz crystal blank) is described as an example. The quartz piece is one type of a piezoelectric material (piezoelectric piece) which vibrates in accordance with applied voltage. Note that the piezoelectric oscillator is not limited to the quartz crystal vibrator and may be one using another piezoelectric material such as ceramic. Similarly, the piezoelectric vibrator is not limited to the quartz crystal vibrator and may be one using another piezoelectric material such as ceramic. Also similarly, the piezoelectric vibration element is not limited to the quartz crystal vibration element and may be one using another piezoelectric material such as ceramic.

As depicted in FIG. 1, the crystal oscillator 100 includes the quartz crystal vibrator 1, a mount substrate 130, a lid member 140, and an electronic component 156. Note that the mount substrate 130 and the lid member 140 of the present embodiment corresponds to one example of a "lid body".

The quartz crystal vibrator 1 and the electronic component 156 are accommodated in a space formed between the mount substrate 130 and the lid member 140. The space formed by the mount substrate 130 and the lid member 140 is, for example, hermetically sealed. Note that this space may be hermetically sealed in a vacuum state, or may be hermetically sealed in a state of being filled with gas such as inert gas.

The mount substrate 130 is a flat-plate circuit board. The mount substrate 130 is configured by including, for example, a glass epoxy plate, and a wiring layer patterned on the glass epoxy plate.

The quartz crystal vibrator 1 is provided on one surface (upper surface in FIG. 1) of the mount substrate 130. In more detail, the quartz crystal vibrator 1 is electrically connected to the wiring layer of the mount substrate 130 with a bonding wire 166. Also, with solder 153, the quartz crystal vibrator 1 and the wiring layer of the mount substrate 130 are bonded. With this, the quartz crystal vibrator 1 is sealed in a space formed between the mount substrate 130 and the lid member 140.

The lid member 140 includes a bottom-closed cavity with its one side (lower side in FIG. 1) open. In other words, the lid member 140 includes a flat-plate-shaped roof wall part, a side wall part extending from the outer edge of the roof wall part toward the mount substrate 130, and a flange part extending outward from a tip of the side wall part. The flange part is bonded to one surface (upper surface in FIG. 1) of the mount substrate 130. With this, inside the lid member 140, the quartz crystal vibrator 1 bonded to the mount substrate 130 is accommodated. The lid member 140 is configured of a metal material, and is formed by, for example, drawing of a metal plate.

The electronic component 156 is provided on one surface (upper surface in FIG. 1) of the mount substrate 130. In more detail, with the solder 153, the wiring layer of the mount substrate 130 and the electronic component 156 are bonded. With this, the electronic component 156 is mounted on the mount substrate 130.

The electronic component 156 is electrically connected to the quartz crystal vibrator 1 through the wiring layer of the mount substrate 130. The electronic component 156 is configured by including, for example, a capacitor, an IC chip, and so forth. The electronic component 156 is, for example, part of an oscillation circuit which oscillates the quartz crystal vibrator 1, part of a temperature compensated circuit which compensates for temperature characteristics of the quartz crystal vibrator 1, or the like. When the electronic component 156 includes a temperature compensated circuit, the crystal oscillator 100 may be referred to as a temperature compensated crystal oscillator (TCXO).

Figure 2:
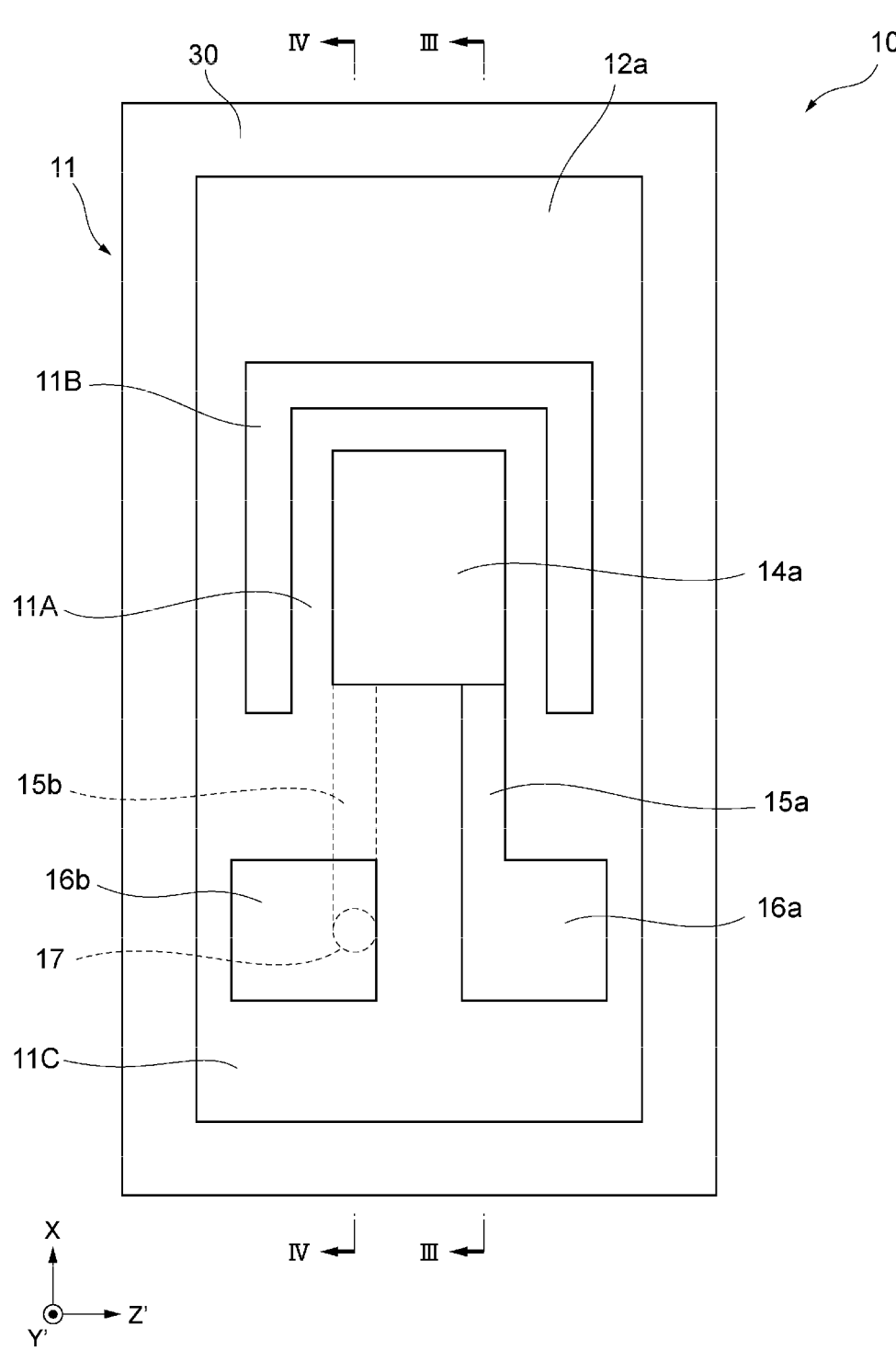
FIG. 2 is a plan view schematically depicting the structure of a quartz crystal vibration element in the one embodiment.
Figure 3:
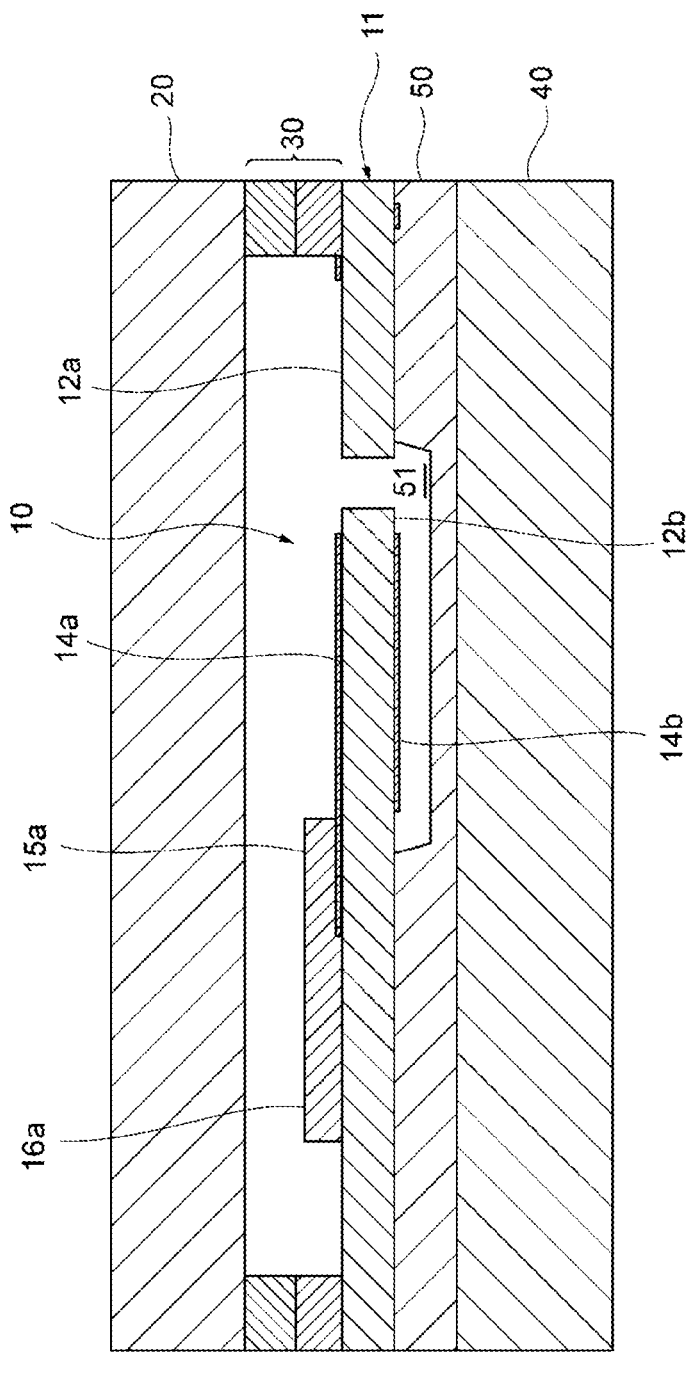
FIG. 3 is a sectional view schematically depicting the structure of a quartz crystal vibrator in the one embodiment.
Figure 4:
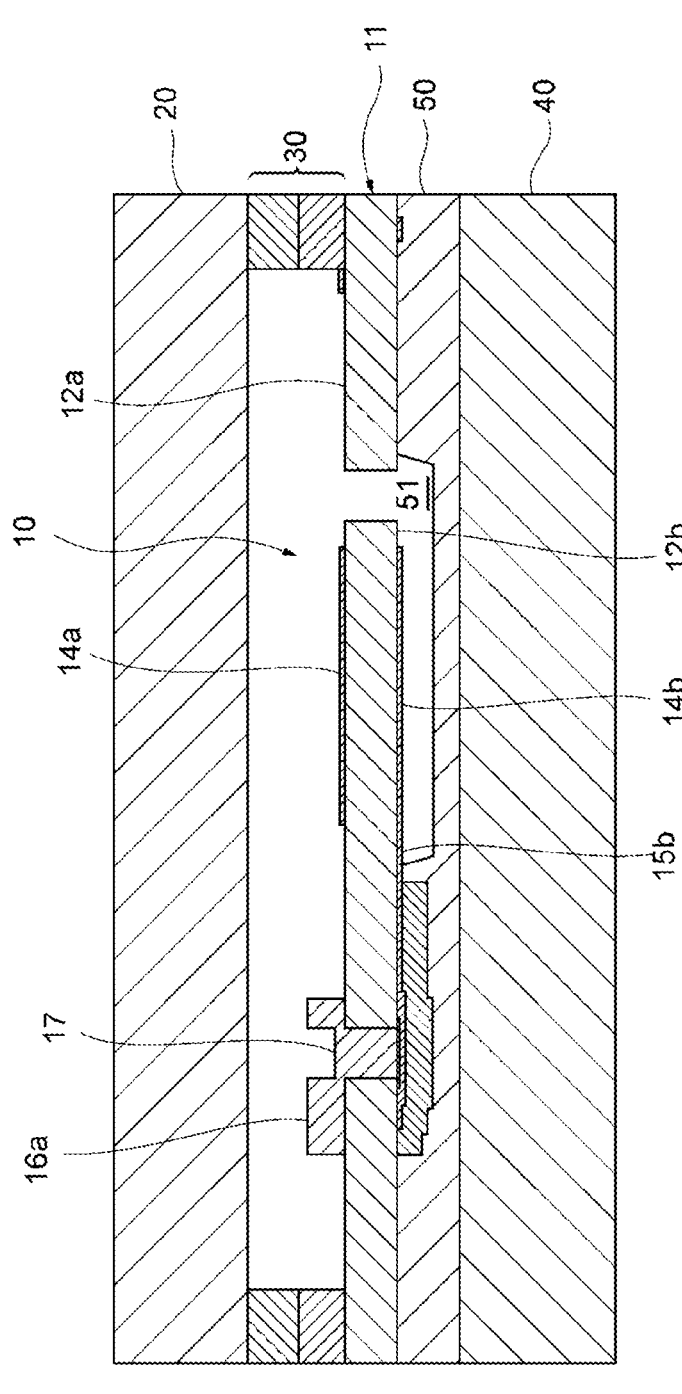
FIG. 4 is a sectional view schematically depicting the structure of the quartz crystal vibrator in the one embodiment.
Figure 4:
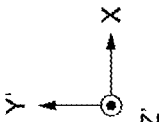

Next, with reference to FIG. 2 to FIG. 4, the schematic structure of the quartz crystal vibrator according to the one embodiment is described. FIG. 2 is a plan view schematically depicting the structure of the quartz crystal vibration element 10 in the one embodiment. FIG. 3 is a sectional view schematically depicting the structure of the quartz crystal vibrator 1 in the one embodiment. FIG. 4 is a sectional view schematically depicting the structure of the quartz crystal vibrator 1 in the one embodiment. Note that FIG. 3 depicts a section parallel to an XY' plane along a III-III line depicted in FIG. 2. FIG. 4 depicts a section parallel to an XY' plane along a IV-IV line depicted in FIG. 2.

The quartz crystal vibrator 1 includes the quartz crystal vibration element 10, an upper lid 20, a bonding part 30, a support substrate 40, and a bonding layer 50.

The quartz crystal vibration element 10 is an element which vibrates crystal by the piezoelectric effect to covert electrical energy and mechanical energy. The quartz crystal vibration element 10 includes the AT-cut-type quartz piece 11. When axes obtained by rotating the Y axis and the Z axis among an X axis, a Y axis, and a Z axis as crystallographic axes of synthetic quartz crystal about the X axis by 35 degrees 15 minutes±1 minute 30 seconds to the direction from the Y axis to the Z axis are taken as a Y' axis and a Z' axis, the AT-cut-type quartz piece 11 is cut out by taking an XZ' plane specified by the X axis and the Z' axis as a principal plane.

Note that the rotation angles of the Y' axis and the Z' axis in the AT-cut-type quartz piece 11 may be inclined from 35 degrees 15 minutes in a range from –5 degrees to 15 degrees. Also, as a cut-angle of the quartz piece 11, a different cut other than the AT cut may be applied, such as BT cut, GT cut, or SC cut.

The quartz crystal vibration element using the AT-cut quartz piece has high frequency stability in a wide temperature range. Also, the AT-cut quartz crystal vibration element is excellent also in temporal change characteristics, and can be manufactured at low cost. Furthermore, the AT-cut quartz crystal vibration element uses thickness shear vibration mode as main vibration.

The quartz crystal vibration element 10 includes one set of excitation electrodes. Between this one set of excitation electrodes, an alternating electric field is applied. With this, by the thickness shear vibration mode, a vibrating part 11A of the quartz piece 11 vibrates with a predetermined oscillation frequency, and resonance characteristics with the vibration can be obtained.

The quartz piece 11 has a first principal surface 12a and a second principal surface 12b which are XZ' planes and opposed to each other. The quartz piece 11 has a flat plate shape. Thus, each of the first principal surface 12a and the second principal surface 12b of the quartz piece 11 is a flat surface. Note that the quartz piece 11 is not limited to have a flat plate shape and may have, for example, a center portion in a convex or concave shape.

The AT-cut-type quartz piece 11 has a long-side direction in which the long side parallel to the X-axis direction extends, a short-side direction in which the short side parallel to the Z'-axis direction extends, and a thickness direction in which the thickness parallel to the Y'-axis direction extends. The quartz piece 11 has a rectangular shape when the first principal surface 12a of the quartz piece 11 is viewed in plan view. The length of the quartz piece 11 in a direction parallel to the X-axis direction is, for example, on the order of 180 μm, and the length of the quartz piece 11 in a direction parallel to the Z'-axis direction is, for example, on the order of 180 μm. Also, the thickness of the quartz piece 11 is, for example, in a range from 0.5 μm to 3 μm, for example, on the order of 1 μm. The quartz piece 11 may be, for example, in a state of having a larger thickness, heating pressure-bonded to the support substrate 40 via the bonding layer 50, which will be described below, and then thinned to have a predetermined thickness by polishing.

Note that the planar shape of the quartz piece 11 is not limited to the rectangular shape. The planar shape of the quartz piece 11 may be a polygonal shape, circular shape, oval shape, or a combination of these.

The quartz piece 11 includes a vibrating part 11A, a groove part 11B, and a retaining part 11C.

The vibrating part 11A of the quartz piece 11 vibrates, as described above, with a predetermined oscillation frequency by taking thickness shear vibration mode as main vibration. The vibrating part 11A has a length in a direction parallel to the X-axis direction being, for example, on the order of 80 μm, and has a length in a direction parallel to the Z'-axis direction being, for example, on the order of 80 μm.

The quartz crystal vibration element 10 includes a first excitation electrode 14a and a second excitation electrode 14b which configure a set of excitation electrodes. The first excitation electrode 14a and the second excitation electrode 14b are provided to the vibrating part 11A of the quartz piece 11. In more detail, the first excitation electrode 14a is provided on the first principal surface 12a, and the second excitation electrode 14b is provided on the second principal surface 12b. The first excitation electrode 14a and the second excitation electrode 14b are provided so as to be opposed to each other, interposing the quartz piece 11 therebetween. The first excitation electrode 14a and the second excitation electrode 14b each have a rectangular shape when the first principal surface 12a is viewed in plan view, and are arranged so as to be substantially entirely overlapped with each other on the XZ' plane. The first excitation electrode 14a and the second excitation electrode 14b each have a length in a direction parallel to the X-axis direction being, for example, on the order of 50 μm, and a length in a direction parallel to the Z'-axis direction being, for example, on the order of 50 μm.

Note that the first excitation electrode 14a and the second excitation electrode 14b are each not limited to have a rectangular shape and the shape may be a polygon, circle, oval, or a combination of these.

The groove part 11B of the quartz piece 11 is a groove formed so as to surround the vibrating part 11A when the first principal surface 12a is viewed in plan view. The groove penetrates in a thickness direction of the quartz piece 11 parallel to the Z'-axis direction. The groove part 11B is formed so that the vibrating part 11A and the retaining part 11C are separated with a space, for example, on the order of 10 μm.

The retaining part 11C of the quartz piece 11 is a portion in the quartz piece 11 other than the vibrating part 11A and the groove part 11B. The retaining part 11C connects to a side of the vibrating part 11A on an X-axis negative direction side to retain the vibrating part 11A.

The quartz crystal vibration element 10 further includes extended electrodes 15a and 15b, connection electrodes 16a and 16b, and a via electrode 17. The extended electrodes 15a and 15b, the connection electrodes 16a and 16b, and the via electrode 17 are provided to the retaining part 11C of the quartz piece 11.

The extended electrode 15a is provided on the first principal surface 12a of the quartz piece 11, electrically connecting the first excitation electrode 14a and the connection electrode 16a. On the other hand, the extended electrode 15b is provided on the second principal surface 12b of the quartz piece 11, electrically connecting the second excitation electrode 14b and the connection electrode 16b. The extended electrode 15b and the connection electrode 16b are electrically connected with the via electrode 17 penetrating in a thickness direction of the quartz piece 11. The structure of the via electrode 17 and its periphery will be described below. Note that the extended electrode 15b of the present embodiment corresponds to one example of a "wiring electrode".

The connection electrode 16a is electrically connected to the first excitation electrode 14a via the extended electrode 15a. Also, the connection electrode 16b is electrically connected to the second excitation electrode 14b via the extended electrode 15b and the via electrode 17. Each of the connection electrode 16a and the connection electrode 16b is a terminal for electrically connecting to an outer electrode (omitted in the drawing) provided to the upper lid 20. The connection electrode 16a and the connection electrode 16b are each provided on the first principal surface 12a of the quartz piece 11. The connection electrode 16a and the connection electrode 16b each have a length in a direction parallel to the X-axis direction being, for example, on the order of 15 μm, and a length in a direction parallel to the Z'-axis direction being, for example, on the order of 20 μm.

In this manner, the first excitation electrode 14a is provided on the first principal surface 12a, the second excitation electrode 14b is provided on the second principal surface 12b, and the extended electrode 15b is electrically connected to the second excitation electrode 14b. With this, for example, via the extended electrodes 15a and 15b, the connection electrodes 16a and 16b, and the via electrode 17, an alternating electric field is applied to the first excitation electrode 14a and the second excitation electrode 14b. Thus, in the quartz piece 11, by a portion provided with the first excitation electrode 14a and the second excitation electrode 14b, it is possible to achieve the vibrating part 11A which vibrates in predetermined vibration mode.

The material of the first excitation electrode 14a, the second excitation electrode 14b, the extended electrodes 15a and 15*b*, and the connection electrodes 16*a* and 16*b* is preferably, for example, aluminum (Al). In this case, the thickness of aluminum is, for example, on the order of 0.05 μm. In this manner, with the material of the extended electrode 15*b* being aluminum with high conduction and small density, unwanted vibration of the vibrating part 11A is difficult to occur, and a piezoelectric vibration element with high frequency vibration can be easily achieved.

The first excitation electrode 14*a*, the second excitation electrode 14*b*, the extended electrodes 15*a* and 15*b*, and the connection electrodes 16*a* and 16*b* are not limited to be configured of aluminum (Al). The material of each electrode may be, for example, molybdenum (Mo) or gold (Au). In this case, the thickness of each is, for example, in a range from 0.03 μm to 0.2 μm. Also, each electrode may be, for example, a multilayer body configured of a titanium (Ti) layer provided on a quartz piece 11 side and a gold (Au) layer provided on a front surface side. In this case, the thickness of the titanium layer is, for example, on the order of 0.005 μm, and the thickness of the gold layer is, for example, on the order of 0.05 μm.

Among the first excitation electrode 14*a*, the second excitation electrode 14*b*, the extended electrodes 15*a* and 15*b*, and the connection electrodes 16*a* and 16*b*, at least the second excitation electrode 14*b* and the extended electrode 15*b* are preferably integrally formed. With this, the second excitation electrode 14*b* and the extended electrode 15*b* having the same thickness (thinness) can be easily formed. Therefore, when the vibrating part 11A is vibrated with high frequency, occurrence of unwanted vibration can be suppressed.

Also, the material of the first excitation electrode 14*a* is preferably identical to the material of the second excitation electrode 14*b*. With this, the vibrating part 11A which vibrates with high accuracy with a predetermined frequency can be easily achieved.

The upper lid 20 may be a flat plate-shaped member, for example, a quartz plate, ceramic plate, glass plate, or the like. The dimensions of the upper lid 20 in plan view are equal to or substantially equal to the dimensions of the quartz crystal vibration element 10 (quartz piece 11). The length of the upper lid 20 in a direction parallel to the X-axis direction is, for example, on the order of 180 μm, and the length of the upper lid 20 in a direction parallel to the Z'-axis direction is, for example, on the order of 180 μm. Also, the thickness of the upper lid 20 is, for example, in a range from 100 μm to 200 μm.

The upper lid 20 may have conductivity. In this case, the upper lid 20 is configured of a 42 alloy, which is an alloy containing iron (Fe) and nickel (Ni); Kovar, which is an alloy containing iron (Fe), nickel (Ni), and cobalt (Co); or the like.

The bonding part 30 bonds the upper lid 20 and the quartz crystal vibration element 10. A space formed by the bonded upper lid 20 and quartz crystal vibration element 10 forms part of a vibration space of the vibrating part 11A. The bonding part 30 is provided to the entire perimeter of each of the upper lid 20 and the quartz crystal vibration element 10. Specifically, the bonding part 30 is provided to a lower surface of the upper lid 20 and the first principal surface 12*a* of the quartz piece 11. The bonding part 30 has a frame shape when the first principal surface 12*a* is viewed in plan view. The width of the frame, that is, a difference between the outer periphery and the inner periphery is, for example, approximately 20 μm.

Also, the bonding part 30 has electrical insulation (non-conductivity). The bonding part 30 is configured of, for example, inorganic glass, and is a glass adhesive which is solidified by heat treatment to exhibit a bonding action. Inorganic glass is, for example, low-melting-point glass such as lead-borate-based or tin-phosphate-based one.

When the material of the bonding part 30 is a low-melting-point glass adhesive, the material may contain lead-free vanadium (V)-based glass which melts at temperatures 300° C. to 410° C. With a binder and a solvent added as pastes, melted, and solidified, the vanadium-based glass exhibits a bonding action. The vanadium-based glass may contain another metal such as silver (Ag).

Also, the material of the bonding part 30 may be, for example, a resin adhesive. The resin adhesive may contain thermosetting resin or photosetting resin and, for example, an epoxy based adhesive agent having epoxy resin as a main component can be used. As epoxy resin, for example, bifunctional epoxy resin such as bisphenol-A-type epoxy resin or bisphenol-F-type epoxy resin; novolac-type epoxy resin such as phenol-novolac-type epoxy resin or cresol-novolac-type epoxy resin; or the like can be used. Also, a generally known one can also be used, such as polyfunctional epoxy resin, glycidyl-amin-type epoxy resin, hetero-cycle-containing epoxy resin, or alicyclic epoxy resin.

The support substrate 40 is configured to support the quartz crystal vibration element 10 so that the quartz crystal vibration element 10 can vibrate. The support substrate 40 is, for example, a flat plate-shaped substrate. The dimensions of the support substrate 40 in plan view are equal to or substantially equal to the dimensions of the quartz crystal vibration element 10 (quartz piece 11). The length of the support substrate 40 in a direction parallel to the X-axis direction is, for example, on the order of 180 μm, and the length of the support substrate 40 in a direction parallel to the Z'-axis direction is, for example, on the order of 180 μm. Also, the thickness of the support substrate 40 is, for example, in a range from 50 μm to 500 μm. The support substrate 40 is, for example, a quartz substrate, but is not limited thereto and may be a silicon substrate.

The bonding layer 50 bonds the quartz crystal vibration element 10 and the support substrate 40. In more detail, the bonding layer 50 is provided on an upper surface of the support substrate 40, and bonds the upper surface of the support substrate 40 and the second principal surface 12*b* of the quartz piece 11.

In this manner, with the bonding layer 50 bonding the quartz crystal vibration element 10 and the support substrate 40, it is possible to seal the quartz crystal vibration element 10, for example, between the upper lid 20 and the support substrate 40.

Also, the bonding layer 50 has a concave-shaped cavity 51 formed in a portion corresponding to the vibrating part 11A of the quartz crystal vibration element 10. A space formed by the quartz crystal vibration element 10 and the cavity 51 of the bonding layer 50 forms part of a vibration space of the vibrating part 11A. The thickness of the cavity 51 is, for example, on the order of 0.2 μm.

The material of the bonding layer 50 is, for example, silicon oxide film (silicon dioxide ($SiO_2$)). The thickness of the bonding layer 50 is desirably equal to or larger than 0.5 μm and, for example, on the order of 1 μm. In this manner, with the material of the bonding layer 50 being silicon dioxide and the bonding layer 50 bonding the upper surface of the support substrate 40 and the second principal surface 12*b* of the quartz piece 11, a protective electrode 19, which will be described below, is present between the quartz piece 11 and the bonding layer 50 in the periphery of the via electrode 17. Thus, stress due to a thermal expansion difference between the quartz piece 11 and the bonding layer 50 as silicon dioxide can be mitigated. Therefore, the vibration frequency of the vibrating part 11A can be stabilized.

Note that the material of the bonding layer 50 is not limited to the silicon oxide film and may be a silicon nitride film (silicon nitride ($Si_3N_4$)) or any of various adhesives. Also, the bonding layer 50 may be omitted and the support substrate 40 may be directly bonded to the quartz crystal vibration element 10.

Figure 5:
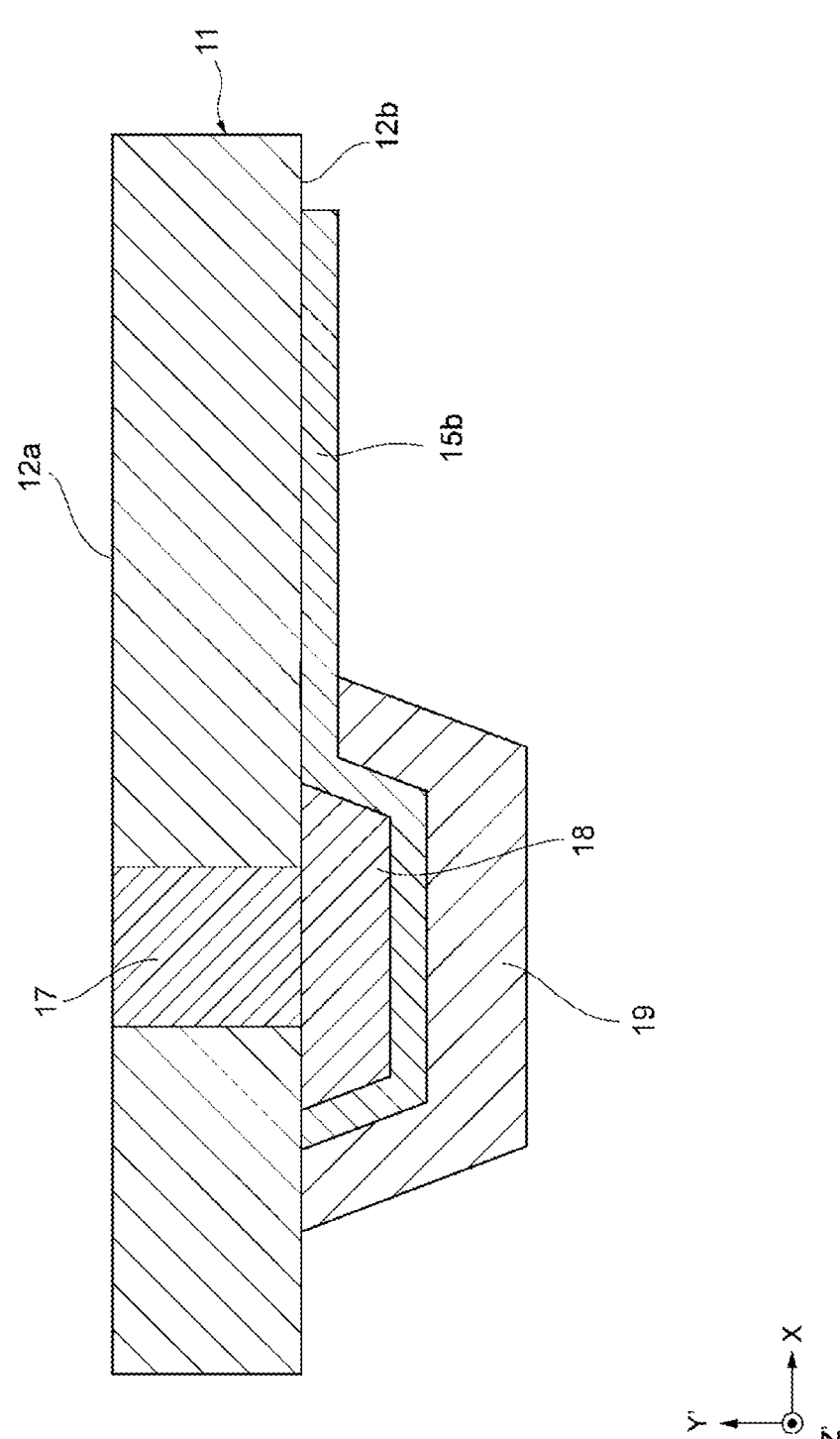
FIG. 5 is an enlarged sectional view of main portions schematically depicting one example of the structure of a via electrode and its periphery depicted in FIG. 4.
Figure 6:
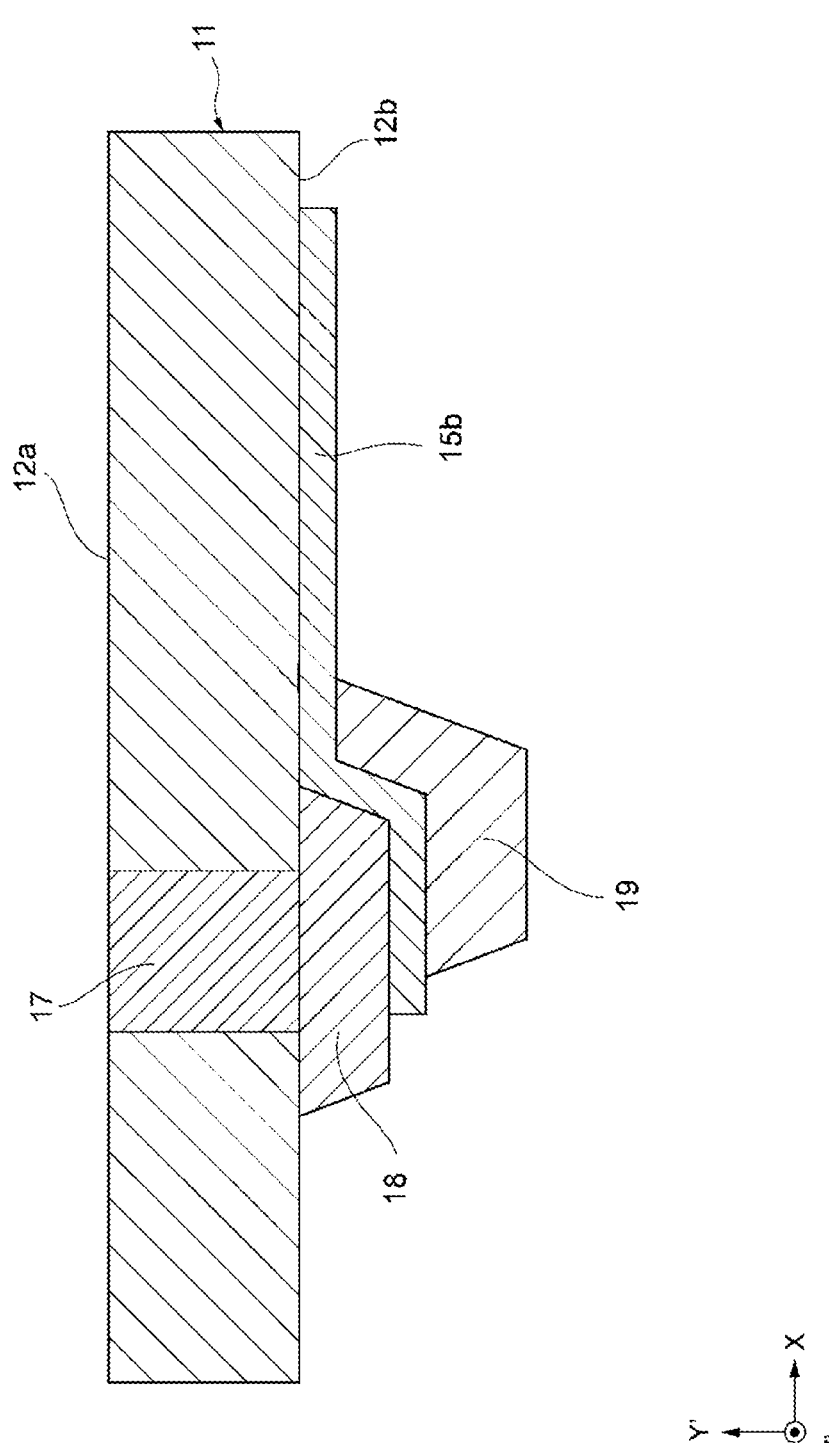
FIG. 6 is an enlarged sectional view of main portions schematically depicting another example of the structure of a via electrode and its periphery depicted in FIG. 4.
Figure 6:
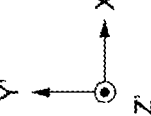

Next, with reference to FIG. 5 and FIG. 6, the structure of the via electrode and its periphery of the quartz crystal vibration element according to the one embodiment are described. FIG. 5 is an enlarged sectional view of main portions schematically depicting one example of the structure of the via electrode 17 and its periphery depicted in FIG. 4. FIG. 6 is an enlarged sectional view of main portions schematically depicting another example of the structure of the via electrode 17 and its periphery depicted in FIG. 4.

As depicted in FIG. 5, the via electrode 17 is provided to penetrate from the first principal surface 12a to the second principal surface 12b of the quartz piece 11. The material of the via electrode 17 is, for example, aluminum (Al), and the thickness of the via electrode 17 is, for example, 1.0 µm. Note that the material of the via electrode 17 may be, for example, copper (Cu). In this case, the thickness of the via electrode 17 is, for example, in a range from 0.5 µm to 3.0 µm.

The via electrode 17 is electrically connected to the connection electrode 16b, omitted in the drawing, on the first principal surface 12a. On the other hand, the via electrode 17 is electrically connected to an etch stop film 18 on the second principal surface 12b.

The etch stop film 18 covers the entire via electrode 17 on the second principal surface 12b of the quartz piece 11. The etch stop film 18 has conductivity, electrically connecting to the via electrode 17.

The above-described extended electrode 15b covers the entire etch stop film 18 on the second principal surface 12b. With this, via the via electrode 17, the etch stop film 18, and the extended electrode 15b, the connection electrode 16b and the second excitation electrode 14b are electrically connected.

Also, the etch stop film 18 is configured of a material having resistance against a chemical agent for use in forming the via electrode 17, for example, hydrofluoric acid. Specifically, when the via electrode 17 is formed, the etch stop film 18 is first formed on the second principal surface 12b of the quartz piece 11 so as to correspond to a position on the retaining part 11C of the quartz piece 11 where the via electrode 17 is to be formed. The etch stop film 18 is formed by, for example, vapor deposition and the lift-off method, or sputtering, etching, and so forth. Next, by wet etching or dry etching, a hole penetrating through the quartz piece 11 and having a diameter on the order of 10 µm is formed. Then, by filling the hole with a conductive material, the via electrode 17 is formed.

As one having these properties, for example, nickel (Ni) is used for the etch stop film 18. The thickness of the etch stop film 18 is, for example, 0.05 µm. Also, the material of the etch stop film may be, for example, copper (Cu) or platinum (Pt). In this case, the thickness of the etch stop film 18 is, for example, in a range from 0.03 µm to 0.2 µm.

Here, the etch stop film 18 having a predetermined thickness forms a step on its outer edge. By contrast, the extended electrode 15b is patterned (formed) together with the second excitation electrode 14b by, for example, vapor deposition and the lift-off method, or sputtering, etching, and so forth. The first excitation electrode 14a and the second excitation electrode 14b are formed thinly to suppress unwanted vibration of the vibrating part 11A, and the thickness of the extended electrode 15b is on the order of 0.03 µm to 0.2 µm. Thus, the extended electrode 15b covering the etch stop film 18 tends to have a wire break at the step on the outer edge of the etch stop film 18.

The quartz crystal vibration element 10 of the present embodiment further includes, on the second principal surface 12b, the protective electrode 19 covering the entire portion of the extended electrode 15b that covers the etch stop film 18. The material of the protective electrode 19 is, for example, aluminum (Al). The thickness of the protective electrode 19 is preferably thicker than the thickness of the extended electrode 15b, for example, 0.5 µm. Note that the material of the protective electrode 19 may be, for example, copper (Cu). In this case, the thickness of the protective electrode 19 is, for example, in a range from 0.3 µm to 1.0 µm.

The protective electrode 19 is formed by, for example, vapor deposition and the lift-off method, or sputtering, etching, and so forth. The protective electrode 19 preferably covers the extended electrode 15b as extending to the cavity 51 of the bonding layer 50 forming a vibration space.

The material of the protective electrode 19 is preferably identical to the material of the extended electrode 15b. With this, stress due to a thermal expansion difference does not occur between the extended electrode 15b and the protective electrode 19, and the extended electrode 15b and the protective electrode 19 can be easily formed.

Note that while the example is described in FIG. 5 in which the extended electrode 15b covers the entire etch stop film 18 on the second principal surface 12b, this is not meant to be restrictive. For example, as depicted in FIG. 6, the extended electrode 15b is only required to cover at least part of the outer edge of the etch stop film 18 on the second principal surface 12b. Similarly, the protective electrode 19 is not limited to a case of covering the entire portion of the extended electrode 15b that covers the etch stop film 18 on the second principal surface 12b. The protective electrode 19 is only required to cover at least a portion of the extended electrode 15b that covers the outer edge of the etch stop film 18.

In this manner, with the etch stop film 18 covering the via electrode 17 on the second principal surface 12b of the quartz piece 11 and the extended electrode 15b covering at least part of the outer edge of the etch stop film 18 on the second principal surface 12b, the conductive etch stop film 18 electrically connects the via electrode 17 and the extended electrode 15b. Also, for example, when a hole penetrating from the first principal surface 12a to the second principal surface 12b is formed to form the via electrode 17, since the etch stop film 18 is present between the quartz piece 11 and the extended electrode 15b on the second principal surface 12b, the extended electrode 15b is not exposed with respect to an etching chemical agent or the like. Therefore, while conductivity is retained, damage on the extended electrode 15b by etching can be suppressed.

Also, on the second principal surface 12b, the protective electrode 19 covers at least a portion of the extended electrode 15b that covers the outer edge of the etch stop film 18. Here, as described above, by the step formed on the outer edge of the etch stop film 18, the extended electrode 15b tends to have a wire break. Thus, a conduction failure can occur near the outer edge of the etch stop film 18. Thus, with the protective electrode 19 covering the portion of the extended electrode 15b that covers the outer edge of the etch stop film 18, the strength of the portion of the extended electrode 15b is enhanced, and a wire break of the extended electrode 15b can be suppressed.

Also, the thickness of the protective electrode 19 is preferably twice as large as the thickness of the extended electrode 15b or larger. With this, the strength of the portion of the extended electrode 15b that covers the outer edge of the etch stop film 18 can be easily enhanced.

Next, a modification of the above-described embodiment is described. Note that structures identical or similar to the structures depicted in FIG. 1 to FIG. 6 are provided with the same or similar reference characters and their description is omitted as appropriate. Also, similar operations and effects by similar structures are not mentioned one by one.

(Modification)

Figure 7:
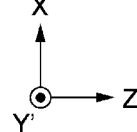
FIG. 7 is a plan view schematically depicting the structure of a quartz crystal vibration element in a modification of the one embodiment.

FIG. 7 is a plan view schematically depicting the structure of a quartz crystal vibration element 10A in a modification of the one embodiment.

As depicted in FIG. 7, a quartz piece 11' of the quartz crystal vibration element 10A further includes coupling parts 11D and 11E, in addition to the vibrating part 11A, the groove part 11B, and the retaining part 11C.

The coupling parts 11D and 11E each couple the vibrating part 11A and the retaining part 11C. More specifically, when the first principal surface 12a of the quartz piece 11' is viewed in plan view, the coupling part 11D couples the vibrating part 11A and the retaining part 11C on one side (lower side in FIG. 7) with respect to the vibrating part 11A. When the first principal surface 12a is viewed in plan view, the coupling part 11E couples the vibrating part 11A and the retaining part 11C on the other side (upper side in FIG. 7) with respect to the vibrating part 11A. The coupling parts 11D and 11E each have a length in a direction parallel to the X-axis direction being, for example, on the order of 10 μm, and a length in a direction parallel to the Z'-axis direction being, for example, on the order of 16 μm.

The extended electrode 15a is provided, on the first principal surface 12a, to the coupling part 11D and the retaining part 11C on one side (underside in FIG. 7) with respect to the vibrating part 11A. On the other hand, the extended electrode 15b is provided, on the second principal surface 12b, to the coupling part 11E and the retaining part 11C on the other side (upper side in FIG. 7) with respect to the vibrating part 11A.

The connection electrode 16a is provided, on the first principal surface 12a, to the retaining part 11C on one side (underside in FIG. 7) with respect to the vibrating part 11A. On the other hand, the connection electrode 16b is provided, on the first principal surface 12a, to the retaining part 11C on the other side (upper side in FIG. 7) with respect to the vibrating part 11A.

The via electrode 17 is at the retaining part 11C on the other side (upper side in FIG. 7) with respect to the vibrating part 11A and penetrates through the quartz piece 11' in a thickness direction.

The structures of the via electrode 17, the etch stop film 18, the extended electrode 15b, and the protective electrode 19 are similar to the examples depicted in FIG. 5 and FIG. 6.

In the above, the exemplary embodiment of the present invention has been described. In the quartz crystal vibration element according to the one embodiment, the etch stop film covers the via electrode on the second principal surface of the quartz piece, and the extended electrode covers at least part of the outer edge of the etch stop film on the second principal surface. With this, the conductive etch stop film electrically connect the via electrode and the extended electrode. Also, for example, when a hole penetrating from the first principal surface to the second principal surface to form the via electrode, since the etch stop film is present between the quartz piece and the extended electrode on the second principal surface, the extended electrode is not exposed with respect to an etching chemical agent or the like. Therefore, while conductivity is retained, damage on the extended electrode by etching can be suppressed.

Also, in the above-described quartz crystal vibration element, the protective electrode covers at least the portion of the extended electrode that covers the outer edge of the etch stop film on the second principal surface. Here, as described above, by the step formed on the outer edge of the etch stop film, the extended electrode tends to have a wire break. Thus, a conduction failure can occur near the outer edge of the etch stop film. Thus, with the protective electrode covering the portion of the extended electrode that covers the outer edge of the etch stop film, the strength of the portion of the extended electrode is enhanced, and a wire break of the extended electrode can be suppressed.

Also, in the above-described quartz crystal vibration element, the material of the protective electrode is identical to the material of the extended electrode. With this, stress due to a thermal expansion difference does not occur between the extended electrode and the protective electrode, and the extended electrode and the protective electrode can be easily formed.

Also, in the above-described quartz crystal vibration element, the thickness of the protective electrode is twice as large as the thickness of the extended electrode or larger. With this, the strength of the portion of the extended electrode that covers the outer edge of the etch stop film can be easily enhanced.

Also, in the above-described quartz crystal vibration element, the material of the extended electrode is aluminum with high conduction and small density. With this, unwanted vibration of the vibrating part is difficult to occur, and a piezoelectric vibration element with high frequency vibration can be easily achieved.

Also, in the above-described quartz crystal vibration element, the first excitation electrode is provided to the first principal surface, the second excitation electrode is provided to the second principal surface, and the extended electrode is electrically connected to the second excitation electrode. With this, for example, via the extended electrodes, the connection electrodes, and the via electrode, an alternating electric field is applied to the first excitation electrode and the second excitation electrode. Thus, in the quartz piece, by a portion provided with the first excitation electrode and the second excitation electrode, it is possible to achieve the vibrating part which vibrates in predetermined vibration mode.

Also, in the above-described quartz crystal vibration element, the second excitation electrode and the extended electrode are integrally formed. With this, the second excitation electrode and the extended electrode having the same thickness (thinness) can be easily formed. Therefore, when the vibrating part is vibrated with high frequency, occurrence of unwanted vibration can be suppressed.

Also, in the above-described quartz crystal vibration element, the material of the first excitation electrode is identical to the material of the second excitation electrode. With this, the vibrating part which vibrates with high accuracy with a predetermined frequency can be easily achieved.

Also, in the quartz crystal vibrator according to the one embodiment, it includes the above-described quartz crystal vibration element and a support substrate supporting the quartz crystal vibration element so that the quartz crystal vibration element can vibrate. With this, a quartz crystal vibrator which suppresses damage on an extended electrode by etching while retaining conductivity can be easily achieved.

Also, in the above-described quartz crystal vibrator, the bonding layer bonds the quartz crystal vibration element and the support substrate. With this, it is possible to seal the quartz crystal vibration element, for example, between the upper lid and the support substrate.

Also, in the above-described quartz crystal vibrator, the material of the bonding layer is silicon dioxide, and the bonding layer bonds the upper surface of the support substrate and the second principal surface of the quartz piece. With this, the protective electrode is present between the quartz piece and the bonding layer in the periphery of the via electrode. Thus, stress due to a thermal expansion difference between the quartz piece and the bonding layer as silicon dioxide can be mitigated. Therefore, the vibration frequency of the vibrating part can be stabilized.

Also, in the crystal oscillator according to the one embodiment, it includes the above-described quartz crystal vibrator, a mount substrate, and a lid member. With this, a crystal oscillator which suppresses damage on an extended electrode by etching while retaining conductivity can be easily achieved.

Note that the above-described embodiment is to facilitate understanding of the present invention and is not to limit the present invention for interpretation. The present invention can be changed/modified without deviating from its gist and includes its equivalents. That is, those obtained by adding an appropriate design change to the embodiment and/or the modification by a person skilled in the art are also included in the scope of the present invention as long as they have the features of the present invention. For example, each component included in the embodiment and/or the modification and its arrangement, material, condition, shape, size, and so forth are not limited to those exemplarily described, and can be changed as appropriate. Also, the embodiment and the modification represent examples, and it goes without saying that partial replacement or combination of the structures described in different embodiments and/or modifications can be made, and these are also included in the scope of the present invention as long as they include the features of the present invention.

REFERENCE SIGNS LIST 1 quartz crystal vibrator
10, 10A quartz crystal vibration element
11, 11' quartz piece
11A vibrating part
11B groove part
11C retaining part
11D, 11E coupling part
12a first principal surface
12b second principal surface
14a first excitation electrode
14b second excitation electrode
15a, 15b extended electrode
16a, 16b connection electrode
17 via electrode
18 etch stop film
19 protective electrode
20 upper lid
30 bonding part
40 support substrate 50 bonding layer
51 cavity
100 crystal oscillator
130 mount substrate
140 lid member
153 solder
156 electronic component
166 bonding wire

The invention claimed is:

1. A piezoelectric vibration element comprising:
   a piezoelectric piece having a first principal surface and a second principal surface;
   a via electrode penetrating the piezoelectric piece from the first principal surface to the second principal surface thereof;
   a conductive etch stop film covering the via electrode on the second principal surface; and
   a wiring electrode covering at least part of an outer edge of the conductive etch stop film on the second principal surface.

2. The piezoelectric vibration element according to claim 1, wherein a material of the conductive etch stop film is nickel, copper or platinum.

3. The piezoelectric vibration element according to claim 1, wherein a thickness of the conductive etch stop film is 0.03 μm to 0.2 μm.

4. The piezoelectric vibration element according to claim 1, further comprising:
   a protective electrode covering at least a portion of the wiring electrode.

5. The piezoelectric vibration element according to claim 4, wherein a material of the protective electrode is identical to a material of the wiring electrode.

6. The piezoelectric vibration element according to claim 4, wherein a thickness of the protective electrode is at least twice as large as a thickness of the wiring electrode.

7. The piezoelectric vibration element according to claim 6, wherein the thickness of the protective electrode is 0.3 μm to 1.0 μm.

8. The piezoelectric vibration element according to claim 1, further comprising:
   a protective electrode covering an entirety of the wiring electrode.

9. The piezoelectric vibration element according to claim 8, wherein a material of the protective electrode is identical to a material of the wiring electrode.

10. The piezoelectric vibration element according to claim 8, wherein a thickness of the protective electrode is at least twice as large as a thickness of the wiring electrode.

11. The piezoelectric vibration element according to claim 10, wherein the thickness of the protective electrode is 0.3 μm to 1.0 μm.

12. The piezoelectric vibration element according to claim 1, wherein a material of the wiring electrode is aluminum.

13. The piezoelectric vibration element according to claim 1, further comprising:
   a first excitation electrode provided to the first principal surface; and
   a second excitation electrode provided to the second principal surface, wherein
   the wiring electrode is electrically connected to the second excitation electrode.

14. The piezoelectric vibration element according to claim 13, wherein the wiring electrode and the second excitation electrode are integrally formed.

15. The piezoelectric vibration element according to claim 13, wherein a material of the first excitation electrode is identical to a material of the second excitation electrode.

16. A piezoelectric vibrator comprising:

the piezoelectric vibration element according to claim 1; and a support substrate supporting the piezoelectric vibration element so that the piezoelectric vibration element can vibrate.

17. The piezoelectric vibrator according to claim 16, further comprising:

a bonding layer bonding the piezoelectric vibration element and the support substrate.

18. The piezoelectric vibrator according to claim 17, wherein a material of the bonding layer is silicon dioxide, and the bonding layer bonds the second principal surface and the support substrate.

19. A piezoelectric oscillator comprising:

the piezoelectric vibrator according to claim 16; and a lid body attached to the support substrate so as to define a space therebetween for accommodating the piezoelectric vibration element.

\* \* \* \* \*